(12) United States Patent
Jochman

(10) Patent No.: US 11,006,552 B2
(45) Date of Patent: *May 11, 2021

(54) AIR FLOW METHODS AND SYSTEMS FOR A WELDER-GENERATOR

(71) Applicant: ILLINOIS TOOL WORKS INC., Glenview, IL (US)

(72) Inventor: Nathan Joe Jochman, Appleton, WI (US)

(73) Assignee: Illinois Tool Works Inc., Glenview, IL (US)

(*) Notice: Subject to any disclaimer, the term of this patent is extended or adjusted under 35 U.S.C. 154(b) by 614 days.

This patent is subject to a terminal disclaimer.

(21) Appl. No.: 15/295,629

(22) Filed: Oct. 17, 2016

(65) Prior Publication Data

US 2017/0034957 A1    Feb. 2, 2017

Related U.S. Application Data

(63) Continuation of application No. 12/500,032, filed on Jul. 9, 2009, now Pat. No. 9,474,185.

(60) Provisional application No. 61/080,880, filed on Jul. 15, 2008.

(51) Int. Cl.
*H05K 7/20* (2006.01)
*B23K 9/10* (2006.01)
*H02K 9/06* (2006.01)

(52) U.S. Cl.
CPC ........... *H05K 7/20909* (2013.01); *B23K 9/10* (2013.01); *H02K 9/06* (2013.01); *H05K 7/20145* (2013.01)

(58) Field of Classification Search
CPC ... H02K 9/06; H05K 7/20145; H05K 7/20909

USPC ...... 219/133, 134, 130.1, 61.7, 76.11, 86.31, 219/125.11, 126, 130.51, 137 PS; 361/676, 678, 600, 668, 695, 699, 601, 361/622, 623, 641, 818, 836, 704–707, 361/717–719, 816; 363/141, 146, 144; 174/35 R, 16.1, 35 MS

See application file for complete search history.

(56) References Cited

U.S. PATENT DOCUMENTS 4,438,733 A * 3/1984 Sasaki ................. F01L 1/14
                                                 123/198 E
4,835,405 A * 5/1989 Clancey ............. F02B 63/04
                                                 290/1 A (Continued)

OTHER PUBLICATIONS

International Search Report from PCT application No. PCT/US2009/050343, dated Sep. 2, 2009, 7 pgs.

*Primary Examiner* — Dana Ross
*Assistant Examiner* — Ket D Dang
(74) *Attorney, Agent, or Firm* — McAndrews, Held & Malloy, Ltd.

(57) ABSTRACT

Configurations of internal components of a welder-generator are provided to improve efficiency of the cooling of the internal components. Configurations are provided in which a single fan, such as an engine fan, drives a single airflow path through the welder-generator. Configurations are provided in which a primary engine fan drives a first airflow path and a secondary generator fan drives a second airflow path through the welder-generator. Internal components are thermally aligned such that air circulates first through components with low critical operating temperatures and last through components with higher critical operating temperatures.

20 Claims, 7 Drawing Sheets

(56) References Cited

U.S. PATENT DOCUMENTS

| | | | | |
|---|---|---|---|---|
| 5,297,517 A | * | 3/1994 | Brandt | F02B 77/13 |
| | | | | 123/198 F |
| 5,440,450 A | | 8/1995 | Lau | |
| 5,624,589 A | * | 4/1997 | Latvis | B23K 9/32 |
| | | | | 219/133 |
| 5,642,260 A | | 6/1997 | Sigl | |
| 5,731,687 A | * | 3/1998 | Hirano | F02B 63/04 |
| | | | | 123/198 E |
| 5,899,174 A | * | 5/1999 | Anderson | F02B 63/04 |
| | | | | 123/2 |
| 6,081,423 A | | 6/2000 | Griffin | |
| 6,124,567 A | * | 9/2000 | Feldhausen | B23K 9/1006 |
| | | | | 219/130.1 |
| 6,784,574 B2 | | 8/2004 | Turner | |
| 6,803,541 B2 | | 10/2004 | Andersen | |
| 6,888,099 B1 | | 5/2005 | Schneider | |
| 9,474,185 B2 | * | 10/2016 | Jochman | H05K 7/20145 |
| 2002/0000342 A1 | * | 1/2002 | Yamada | F02B 77/13 |
| | | | | 181/204 |
| 2003/0042237 A1 | | 3/2003 | Brofft | |
| 2004/0104578 A1 | * | 6/2004 | Wurtele | B60H 1/00378 |
| | | | | 290/1 A |
| 2005/0155959 A1 | * | 7/2005 | Bender | B23K 9/1006 |
| | | | | 219/133 |
| 2006/0027547 A1 | * | 2/2006 | Silvestro | B23K 9/323 |
| | | | | 219/133 |
| 2006/0037954 A1 | | 2/2006 | Silvestro | |
| 2006/0043083 A1 | | 3/2006 | Bender | |
| 2006/0131885 A1 | * | 6/2006 | Wurtele | B60H 1/00378 |
| | | | | 290/1 A |
| 2007/0205350 A1 | * | 9/2007 | Shimada | H02K 7/1815 |
| | | | | 248/652 |

\* cited by examiner

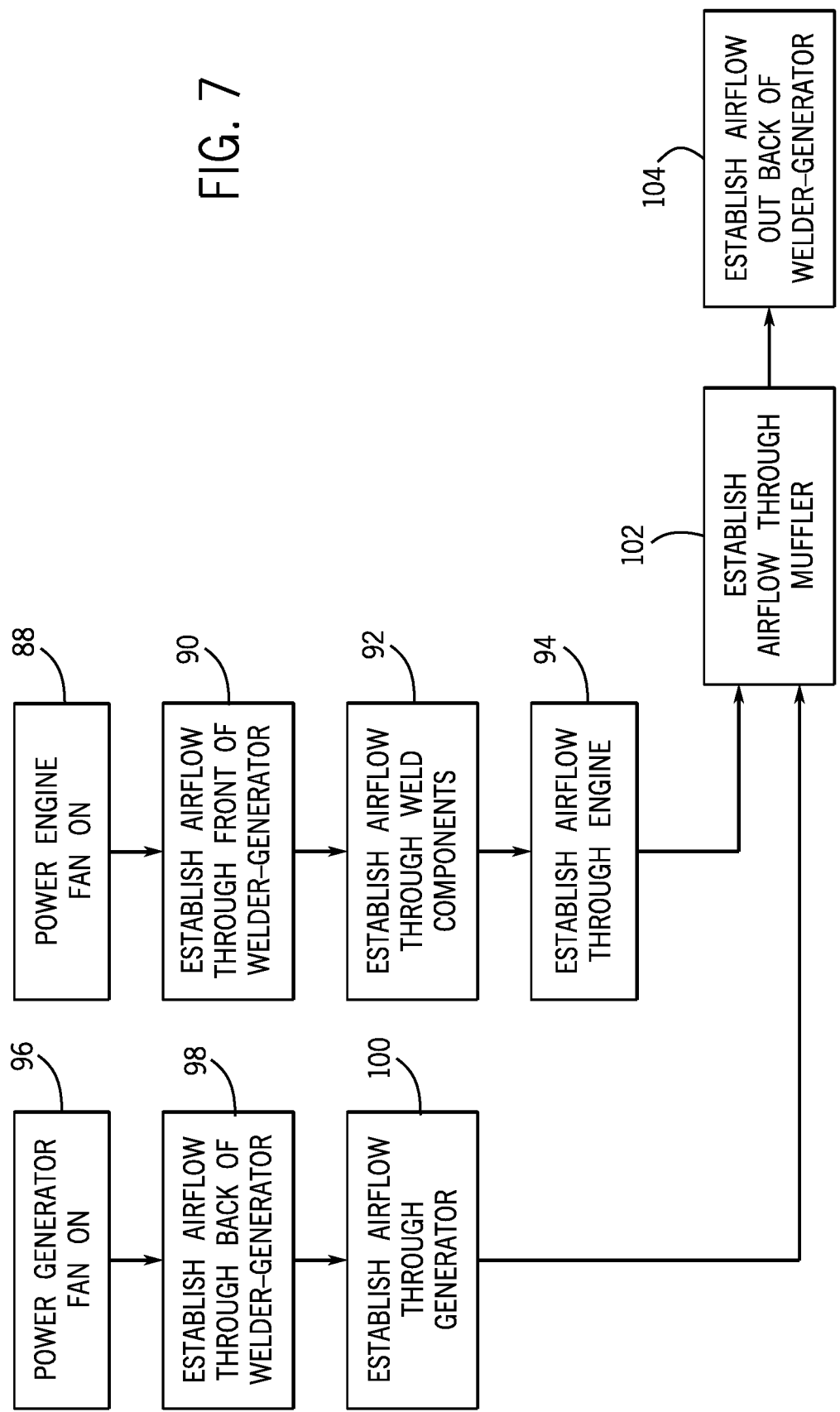

AIR FLOW METHODS AND SYSTEMS FOR A WELDER-GENERATOR

CROSS REFERENCE TO RELATED APPLICATIONS

This application is a Continuation Patent Application of U.S. patent application Ser. No. 12/500,032, entitled "Improved Air Flow Methods and Systems for a Welder-Generator", filed Jul. 9, 2009, which is a US. Non-provisional Patent Application of U.S. Provisional Patent Application No. 61/080,880, entitled "Improved Air Flow in a Welder-Generator", filed Jul. 15, 2008, both of which are herein incorporated by reference in their entireties for all purposes.

BACKGROUND

The present disclosure relates generally to welding devices, and more particularly, to a welder-generator.

Welding is a process that has increasingly become ubiquitous in various industries and applications. While such processes may be automated in certain contexts, a large number of applications continue to exist for manual welding operations, which rely on the use of a welder-generator to power the welding process. Welder-generators typically include internal components, such as electrical circuitry, a generator, an engine, and a muffler, which produce substantial amounts of heat during operation. Accordingly, an engine cooling fan at the rear of the welder-generator and a supplemental fan in the middle of the welder-generator are typically provided to cool the internal components.

The engine cooling fan is typically configured to circulate air from the rear of the welder-generator through the engine to exclusively cool the engine during operation. The supplemental fan is typically located in the center of the welder-generator, and is configured to circulate air from the front of the welder-generator through the electrical circuitry and the generator during operation. The airflow paths generated by the fans typically converge, flow over the engine and the muffler, and exit the rear of the welder-generator. Such airflow systems allow the formation of a hot chamber in the center of the welder-generator and require high volumetric flows to prevent overheating of the internal components. Furthermore, these systems require complex packaging because multiple baffles are needed to direct air along the desired pathways.

BRIEF DESCRIPTION

Configurations of internal components of a welder-generator are provided to improve efficiency of the cooling of the internal components. The disclosed embodiments include configurations in which a single fan, such as an engine fan, drives a single airflow path through the welder-generator. Additionally, embodiments are provided with configurations in which a primary engine fan drives a first airflow path and a secondary generator fan drives a second airflow path through the welder-generator. In disclosed embodiments, internal components are thermally aligned such that air circulates first through components with low critical operating temperatures and last through components with higher critical operating temperatures. Certain embodiments are provided that require alterations to the connection mechanism between the engine and the generator. Accordingly, single bearing and dual bearing embodiments are provided for the connection of the engine and the generator.

DRAWINGS

These and other features, aspects, and advantages of the present disclosure will become better understood when the following detailed description is read with reference to the accompanying drawings in which like characters represent like parts throughout the drawings, wherein:

FIG. 7 is a process flow diagram representing operation of the welder-generator of FIG. 6 in accordance with aspects of the present disclosure.

DETAILED DESCRIPTION

As discussed in further detail below, various embodiments of a welder-generator are provided to efficiently cool internal components. The welder-generator is capable of allowing airflow both in and out of rear vents, configured to facilitate thermal alignment of internal components, capable of circulating airflow with a single fan, capable of reducing the size of internal components as compared to traditional systems, and so forth. The disclosed embodiments include configurations in which a single fan, such as an engine fan, drives a single airflow path through the welder-generator. Additionally, embodiments are provided with configurations in which a primary engine fan drives a first airflow path and a secondary generator fan drives a second airflow path through the welder-generator. Furthermore, internal components are thermally aligned such that air circulates first through components with low critical operating temperatures and last through components with higher critical operating temperatures. The foregoing features, among others, may have the effect of reducing the generation of noise outside the welder-generator, reducing or simplifying the parts (e.g., reducing the number of baffles needed to direct air), reducing the power required to generate the necessary airflow volume, and so forth.

Embodiments are provided that include alterations to the connection mechanism between the engine and the generator. Accordingly, single bearing and dual bearing embodiments are provided for the connection of the engine and the generator. In some embodiments, the charging system may be relocated from the engine to the generator, thus possibly simplifying the flywheel and reducing the weight of the engine assembly. For instance, removal of the charging system from the engine may allow the flywheel to be reduced to a thin plate designed to exclusively hold the ring gear. As discussed below, certain embodiments of the welder-generator integrate some or all of the above described features in a single unit that may be coupled to additional system components during use.

Figure 1:
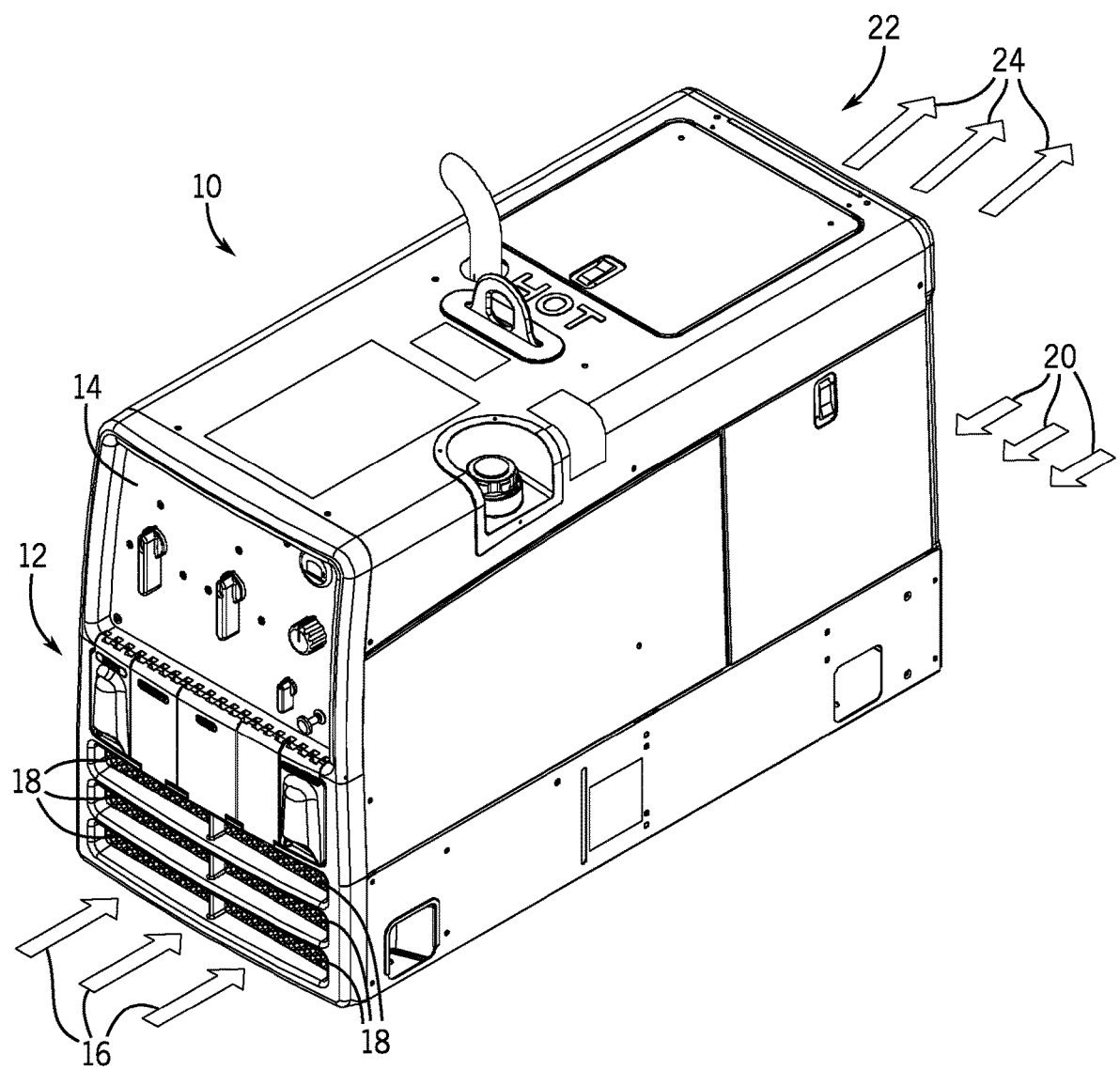
FIG. 1 is a perspective view of an exemplary welder-generator illustrating airflow paths in accordance with aspects of the present disclosure.

Turning now to the drawings, FIG. 1 illustrates an exemplary stick welder-generator 10, which functions to power, control, and provide consumables to a welding operation in accordance with aspects of the present disclosure. However, those skilled in the art would understand that the present disclosure also relates to similar operations that may be performed in which weldments are formed but the welding process differs (i.e., embodiments may be applicable to welder-generators used for MIG welding processes, TIG welding processes, and so forth). Accordingly, the system described herein is envisaged for use with all such operations where power is supplied to a location where welding is carried out. In the illustrated embodiment, a front side 12 of the welder-generator 10 contains a control panel 14, through which a user may control the supply of materials, such as power, gas flow, and so forth, for a welding operation. Air, as represented by arrows 16, may flow into the welder-generator 10 via vents 18 on the front side 12 of the welder-generator 10. Additionally, air, as represented by arrows 20, may flow into the welder-generator 10 via vents (not shown) on a back side 22 of the welder-generator 10. Expelled air, as represented by arrows 24, may also flow out of the welder-generator 10 via vents (not shown) on the back side 22 of the welder-generator. In some embodiments, incoming air, as represented by arrows 16 and 20, may be generally cooler than exiting air, as represented by arrows 24. That is, incoming air 16, 20 may cool internal components of the welder-generator 10, thus making the expelled air warmer. It should be noted that in some embodiments, the welder-generator 10 may be portable and may be communicatively coupled to additional system components, such as a wall power outlet, a battery, and so forth.

Figure 2:
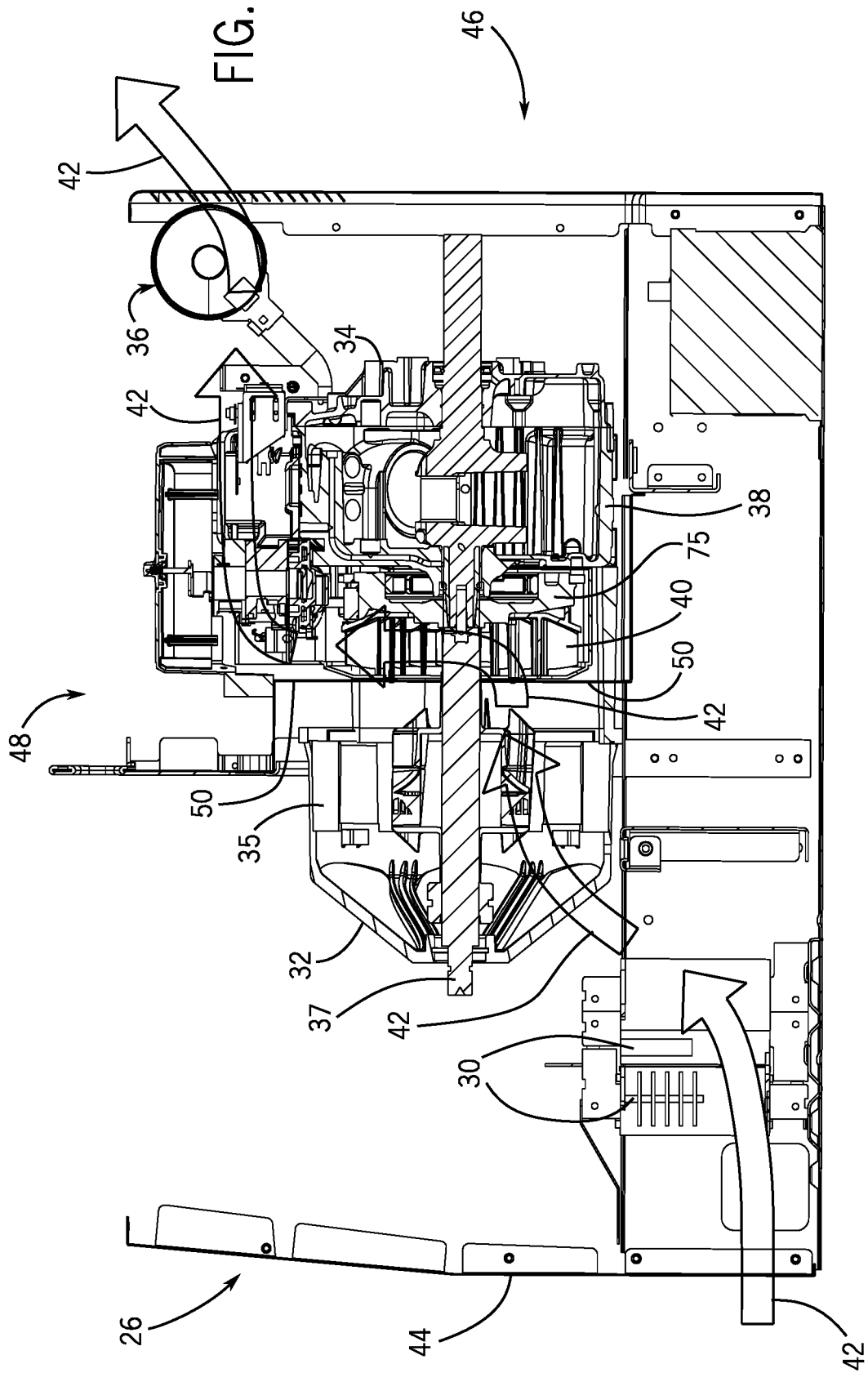
FIG. 2 illustrates an exemplary airflow path through internal components of a welder-generator in accordance with aspects of the present disclosure.

FIG. 2 is a cross sectional view of an exemplary welder-generator 26 illustrating an exemplary layout of internal components in accordance with one embodiment of the present disclosure. The welder-generator 26 includes weld components 30, a generator 32, an engine 34, and a muffler 36. In certain embodiments, weld components 30 may include rectifiers, reactors, stabilizers, electronic modules, PC boards, and so forth. Weld components 30 are generally designed to be maintained at an operating temperature less than a designated level, such as less than approximately 100° C. In the illustrated embodiment, the generator 32 includes a stator 35, which remains stationary and may function as a magnet or an electromagnet, and a rotor 37, which rotates via torque generated by the engine 34 and may function as a magnet or an electromagnet. The generator 32 may be generally designed to be maintained at an operating temperature less than a designated level, such as less than approximately 130° C. The engine 34 includes an engine block 38, which provides a casing for internal components of the engine 34. The engine 34 is generally designed to be maintained at an operating temperature less than a designated level, such as less than approximately 150° C. The engine 34 may include a radiator. The muffler 36, which may include pipes and a can, is generally designed to be maintained at an operating temperature less than a designated level, such as less than approximately 400° C.

The engine 34 also includes a fan 40 that is configured to cool the electrical components 30, the generator 32, the engine 34 and the muffler 36 in the stated order. Accordingly, the fan 40 establishes an airflow path, as represented by arrows 42, through the internal components of the welder-generator 26. That is, the single fan 40 located in the engine 34 cools internal components such that components with low critical operating temperatures (e.g., weld components 30) experience the coolest air and components with high critical operating temperatures (e.g., the muffler 36) experience the hottest air. Thus, the present disclosure may offer distinct advantages over traditional systems because internal components are thermally aligned, where thermally aligned may be defined as placing components with the highest critical operating temperatures later in the air flow route and placing components with the lowest critical operating temperatures earlier in the air flow route. Thermal alignment maintains the desired temperature difference between the cooled component and the air stream performing the cooling for all components in the system. The temperature differential between air and component is directly proportional to the heat transfer achieved, and, thus, maintaining that differential improves the efficiency of a given air flow to provide cooling to components which have varying critical temperatures. For instance, in certain embodiments, thermal alignment of internal components may allow for a reduction in airflow quantities through the welder-generator 26 while maintaining an effective cooling system. Additionally, because internal components are thermally aligned, only the single fan 40 located in the engine 34 is needed to generate the necessary airflow through the welder-generator 26, as compared to multiple fans in traditional systems. The foregoing features, among others, may have the effect of reducing sound, reducing the size of the engine 34 and generator 32 assemblies, simplifying the parts required for the engine 34 and the generator 32, reducing the amount of power necessary to generate cooling airflow through the system, reducing the overall size of the unit, and so forth.

In the embodiment illustrated in FIG. 2, the generator 32 is located in front of the engine 34 relative to and close to a front 44 of the welder-generator 26, and the engine 34 is located behind the generator 32 close to a back 46 of the welder-generator 26, which is similar to configurations in traditional systems. However, the engine 34 is rotated 180° as compared to traditional systems, thus allowing the fan 40 to be located near a center 48 of the welder-generator 26 instead of toward the back 46 of the welder-generator 26. The foregoing configuration may simplify packaging of the welder-generator 26 since only one center baffle 50, as compared to multiple baffles in traditional systems, is used to isolate the engine 34 from other internal components. Additionally, the need for a fan in the generator 32 is eliminated since the fan 40 in the engine 34 is located in the middle 48 of the welder-generator 26.

Figure 3:
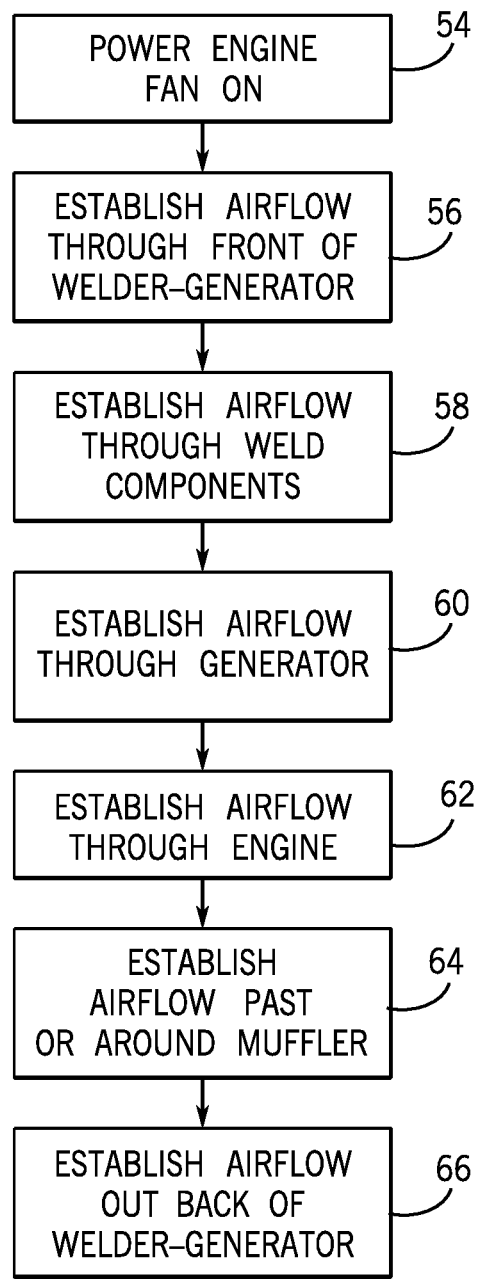
FIG. 3 is a process flow diagram that representing operation of the welder-generator of FIG. 2 in accordance with aspects of the present disclosure.

The disclosed configuration of the generator 32 and the engine 34 as illustrated in FIG. 2 establishes the airflow path 42 through thermally aligned internal components in accordance with the flow chart illustrated in FIG. 3. The airflow path is initiated when the fan 40 located in the engine 34 is powered on, as represented by block 54. The coolest air in the airflow path 42 is then drawn in the front 44 of the welder-generator 26, as represented by block 56. This coolest air is first drawn through the weld components 30, which have a critical operating temperature of approximately 100° C., as represented by block 58. The air is then drawn through the generator 32, which has a critical operating temperature of approximately 130° C., as represented by block 60. Air exiting the generator 32 proceeds through the engine 34, which has a critical operating temperature of approximately 150° C., as represented by block 62. Air exiting the engine 34 then flows past or around the muffler 36, which has a critical operating temperature of approximately 400° C., as represented by block 64. The hottest air then exits the back of the welder-generator 26, as represented by block 66. In this way, a single airflow path 42 may be established to cool the weld components 30, the generator 32, the engine 34, and the muffler 36, which are thermally aligned.

Figure 4:
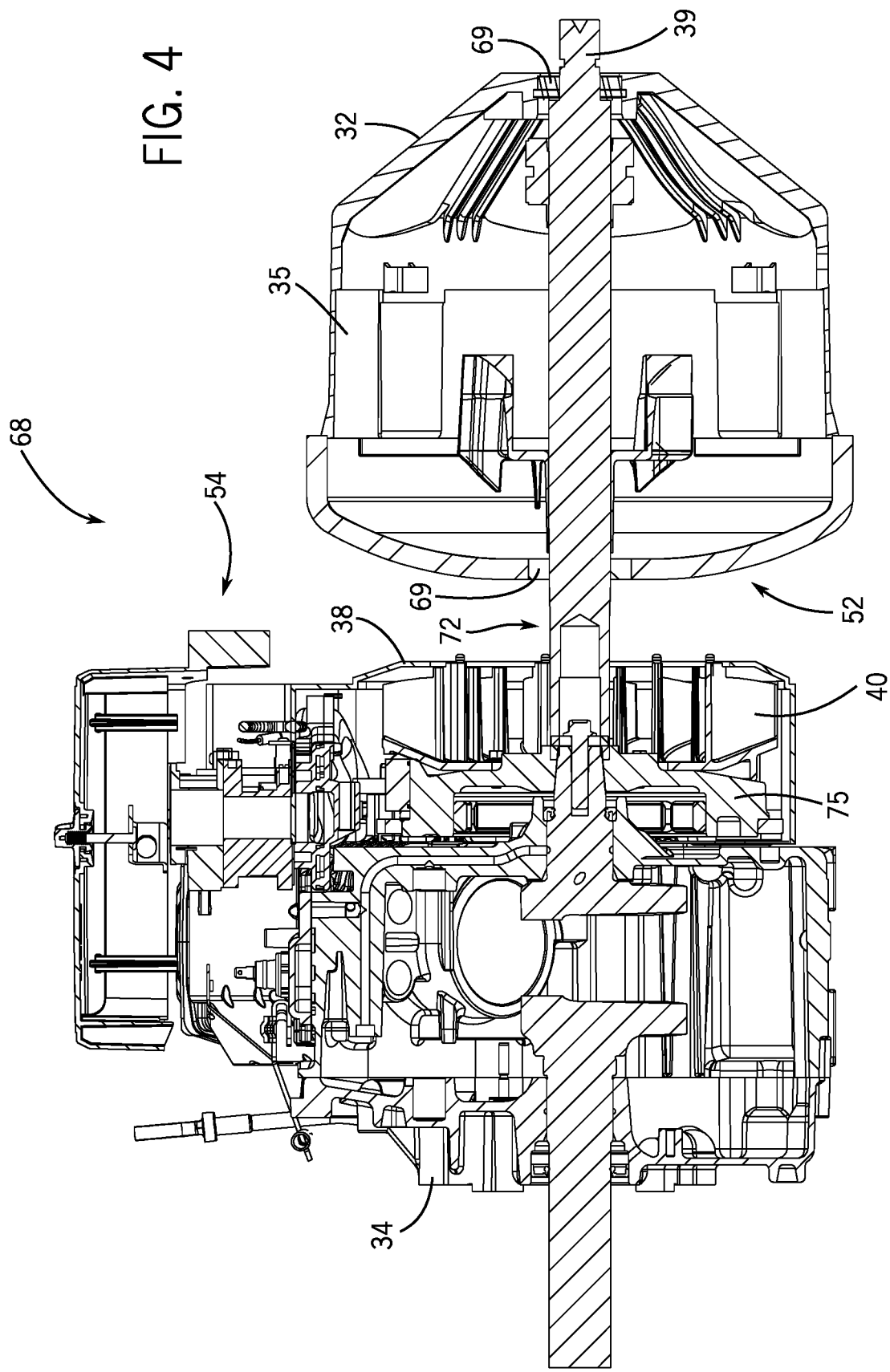
FIG. 4 illustrates an exemplary connection between an engine and a generator that may be used in the exemplary welder-generator of FIG. 2 in accordance with aspects of the present disclosure.
Figure 5:
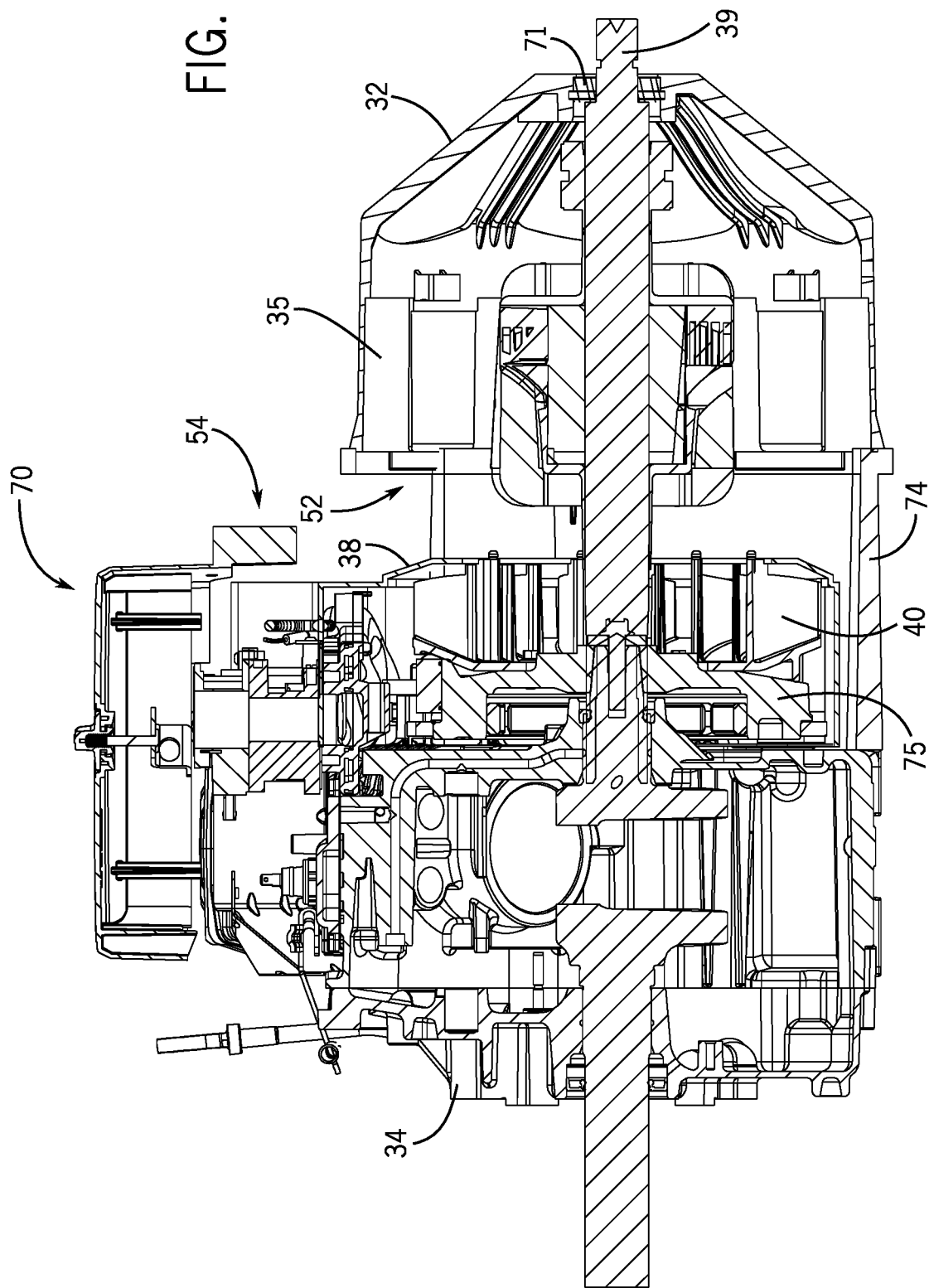
FIG. 5 illustrates an exemplary connection between an engine and a generator that may be used in the exemplary welder-generator of FIG. 2 in accordance with aspects of the present disclosure.

The configuration of the engine 43 and the generator 32 described in FIG. 2 requires a new mode of connection between a back side 52 of the generator 32 and a fan side 54 of the engine 34. FIGS. 4 and 5 illustrate two possible such modes of connection between the generator 32 and the engine 34. In both configurations, a space is left between the fan side 54 of the engine 34 and the back side 52 of the generator 32 to allow for sufficient flow of air through and around the generator 32 as necessary for cooling of the internal components. Specifically, FIGS. 4 and 5 illustrate attachment of the engine 34 to the generator 32 in a 2-bearing design 68 including a pair of bearings 69 and a single bearing design 70 including a single bearing 71, respectively.

FIG. 4 illustrates the 2-bearing design 68 in which a single connection 72 exists, and a shaft 39 connects the engine 34 and the generator 32. In this embodiment, the shaft 39 rotates to transmit power from the engine 34 to the generator 32. The shaft 39 rigidly or flexibly connects the engine 34 and the generator 32 for proper alignment and resists bending and axial loads during operation. The single shaft 39 connection 72 allows the stationary engine block 38 and the stationary stator 35 to remain unconnected, which may have the effect of reducing mechanical complexity.

FIG. 5 illustrates the single bearing design 70 in which two connections exist between the engine 34 and the generator 32. The shaft 39 still connects the rotating assemblies of the engine 34 and the generator 32 with respect to FIG. 4. However, a connector 74 provides an additional connection point and may have the effect of reducing bending loads on the shaft 39 during operation as compared to the 2-bearing design 68. The connector 74 may connect the stator 35 of the generator 32 with the engine block 38 of the engine 34. Accordingly, the single bearing design 70 allows for both the stationary as well as the rotating parts of the engine 34 and the generator 32 to be connected. The foregoing features may have the effect of providing alignment, rigidity, and coupling of the reactionary torque.

In certain embodiments, the configurations of the engine 34 and the generator 32 in the welder-generator 26 illustrated in FIGS. 2-4 may allow for mechanical advantages over traditional designs. For instance, a flywheel 75, an internal component of the engine 34, may be simplified to a flex plate since the fan side 54 of the engine 34 faces the back side 52 of the generator 32, thereby allowing the rotor to provide the inertia necessary for system performance. Additionally, in some embodiments, a charging system may be removed from the engine 34, thus further simplifying the flywheel 75 since the flywheel 75 may only need to support ring gear. These features may have the effect of reducing the weight of the engine 34 and generator 32 assembly.

Figure 6:
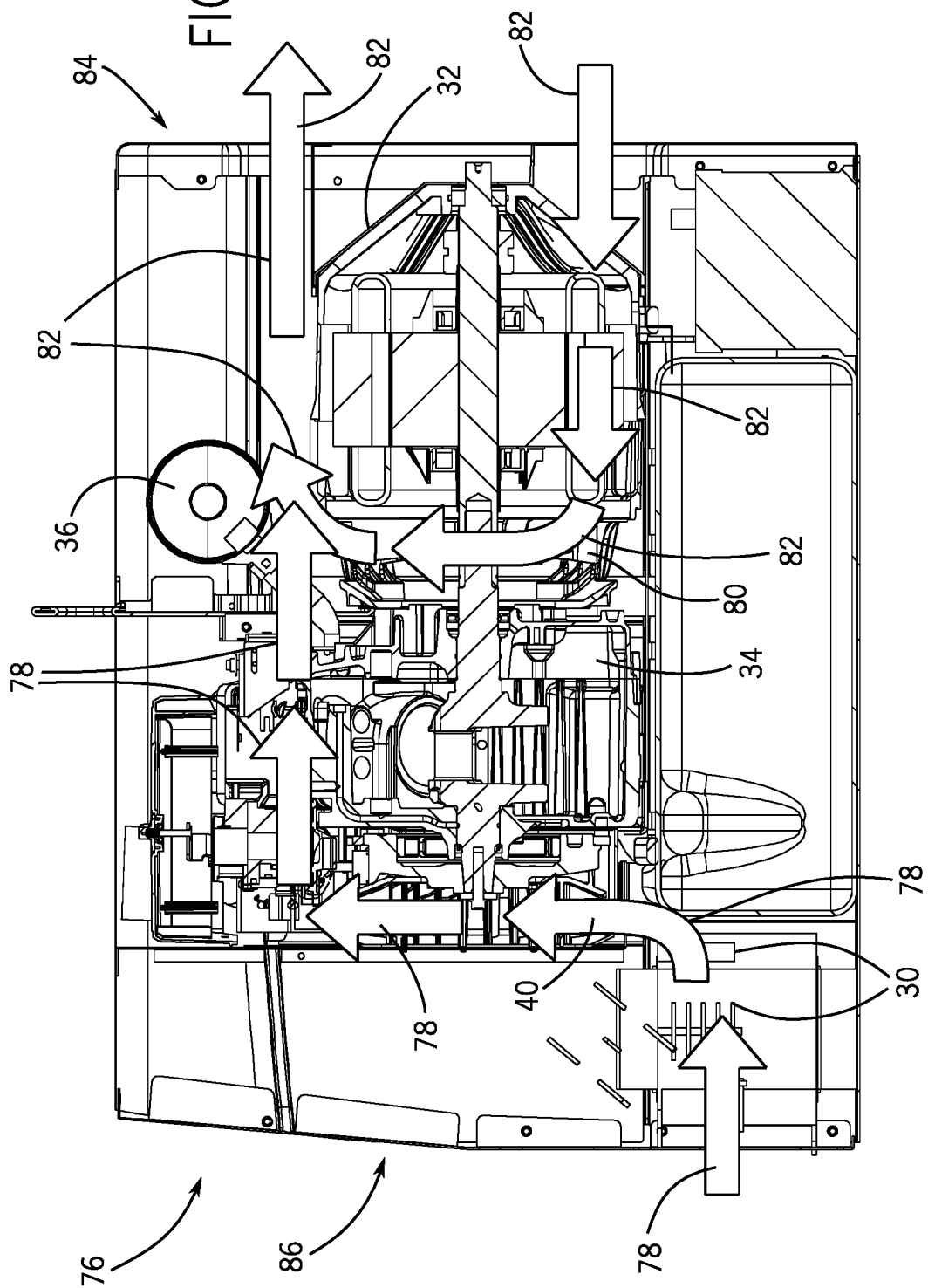
FIG. 6 illustrates exemplary airflow paths through internal components of a welder-generator in accordance with aspects of the present disclosure.

FIG. 6 is a cross sectional view of an exemplary welder-generator 76 illustrating an exemplary layout of internal components in accordance with another embodiment of the present disclosure. The welder-generator 76 still includes weld components 30, the generator 32, the engine 34, and the muffler 36 with respect to FIG. 2. The engine 34 includes the fan 40, and the fan 40 is configured to cool the electrical components 30, the engine 34 and the muffler 36 in the stated order. Accordingly, the fan 40 located in the engine 34 establishes an airflow path, as represented by arrows 78, through select internal components of the welder-generator 76. That is, the fan 40 located in the engine 34 cools select internal components such that components with low critical operating temperatures (e.g., weld components 30) experience the coolest air and components with high critical operating temperatures (e.g., the engine 34 and the muffler 36) experience the hottest air. In this embodiment, an additional fan 80 located in the generator 32 is configured to exclusively cool the generator 32. Accordingly, the fan 80 located in the generator 32 establishes an airflow path, as represented by arrows 82, through the generator 32. The airflow path 82 generated by the fan 80 located in the generator 32 converges with the airflow path 78 generated by the fan 40 located in the engine 34 and exits out a back 84 of the welder-generator 76. The additional fan 80 located in the generator 32 may be smaller than traditional generator fans because the fan 80 would only need to cool a single component.

In the embodiment illustrated in FIG. 6, the engine 34 is located in front of the generator 32 close to a front 86 of the welder-generator 76, and the generator 32 is located behind the engine 34 close to the back 84 of the welder-generator 76. In this embodiment, the engine 34 and the generator 32 remain connected but are rotated together 180° as compared to traditional systems, thus allowing the engine 34 and the generator 32 to be mechanically connected as in previous systems. That is, a new mode of connection between the engine 34 and the generator 32 may not be used in this embodiment. In this embodiment, the generator 32 may fit underneath the muffler 36, thereby allowing for possible shortening of the length of the welder-generator 76 if desired.

The disclosed configuration of the generator 32 and the engine 34 as illustrated in FIG. 6 establishes the airflow paths 78 and 82 through thermally aligned internal components in accordance with the flow chart illustrated in FIG. 7. The airflow path 78 is initiated when the fan 40 located in the engine 34 is powered on, as represented by block 88. The coolest air in the airflow path 78 is then drawn in the front 86 of the welder-generator 76, as represented by block 90. This coolest air is first drawn through the weld components 30, which have a critical operating temperature of approximately 100° C., as represented by block 92. Air exiting the weld components 30 proceeds through the engine 34, which has a critical operating temperature of approximately 150° C., as represented by block 94. The parallel airflow path 82 is initiated when the fan 80 is powered on, as represented by block 96. The fan 80 draws air into the back 84 of the welder-generator 76, as represented by block 98, and through the generator 32, as represented by block 100. The airflow paths 78 and 82 converge and flow around or past the muffler 36, which has a critical operating temperature of approximately 400° C., or through the muffler 36, as represented by block 102. Air exiting the muffler 36 then flows out the back 84 of the welder-generator, as represented by block 104. In this way, airflow paths 78 and 82 may be established to cool the weld components 30, the generator 32, the engine 34, and the muffler 36.

While only certain features of the present disclosure have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. A welder-generator system comprising:
   an engine comprising a fan integral with the engine;
   a generator, wherein the fan is arranged between the generator and the engine;
   a muffler; and
   weld components;
   wherein the fan is configured to establish a single airflow path through which airflow flows to the weld components, to the generator, through the fan, to the engine, and to the muffler in the recited order.

2. The welder-generator system of claim 1, comprising a baffle configured to separate suction and pressure sides of the fan.

3. The welder-generator system of claim 1, wherein the engine, the generator, the muffler, and the weld components are thermally aligned.

4. The welder-generator system of claim 1, wherein the fan and the airflow path are configured to generate airflow that cools internal components of the welder-generator system in an order such that the internal components with the lowest critical operating temperatures are in the coolest air and the internal components with the highest critical operating temperatures are in the hottest air, wherein the internal components include at least the weld components.

5. The welder-generator system of claim 1, wherein the weld components comprise rectifiers, reactors, stabilizers, electronic modules, PC boards, or a combination thereof.

6. The welder-generator system of claim 1, comprising an enclosure, wherein the engine, the generator, the muffler, and the weld components are disposed within the enclosure.

7. A welder-generator system comprising:
   an engine comprising a first fan integral with the engine;
   a generator comprising a second fan integral with the generator, wherein the first fan is arranged on a side of the engine opposite the generator, and the second fan is arranged between the generator and the engine;
   a muffler; and
   weld components;
   wherein the first fan is configured to establish a first airflow path through which a first airflow flows to the weld components, to the engine, and to the muffler in the recited order; and
   wherein the second fan is configured to establish a second airflow path through which a second airflow flows to the generator and to the muffler in the recited order.

8. The welder-generator system of claim 7, comprising a baffle configured to separate suction and pressure sides of the first fan.

9. The welder-generator system of claim 7, wherein the muffler, the engine, and the weld components are thermally aligned, such that the first airflow path and the second airflow path are configured to generate airflow that cools components of the welder-generator system in an order such that components with the lowest critical operating temperatures are in the coolest air and components with the highest critical operating temperatures are in the hottest air.

10. The welder-generator system of claim 7, wherein the first airflow path and the second airflow path converge before exiting the welder-generator system.

11. The welder-generator system of claim 7, wherein the weld components comprise rectifiers, reactors, stabilizers, electronic modules, PC boards, or a combination thereof.

12. The welder-generator system of claim 7, comprising an enclosure, wherein the engine, the generator, the muffler, and the weld components are disposed within the enclosure.

13. The welder-generator system of claim 7, wherein the first airflow path draws air in from a first side of the enclosure, the second airflow path draws air in from a second side of the enclosure opposite the first side, and the first and second airflow paths exit the enclosure at the second side.

14. A method for establishing airflow in a welder-generator comprising:
   establishing a first airflow path from a first fan of the welder-generator through which a first airflow flows to weld components of the welder-generator, to an engine of the welder-generator, and to a muffler of the welder-generator in the recited order, wherein the engine has a first side and a second side, wherein the first fan is integral with the first side; and
   establishing a second airflow path from a second fan of the welder-generator through which a second airflow flows to a generator of the welder-generator and to the muffler in the recited order, wherein the first fan is arranged on a side of the engine opposite the generator, and the second fan is arranged between the generator and the engine.

15. The method of claim 14, wherein suction and pressure sides of the first fan are separated by a baffle.

16. The method of claim 14, wherein the weld components, the engine, and the muffler are thermally aligned.

17. The method of claim 14, wherein the first airflow path and the second airflow path are configured to generate airflow that cools internal components in an order such that the internal components with the lowest critical operating temperatures are in the coolest air and the internal components with the highest critical operating temperatures are in the hottest air, wherein the internal components include at least the weld components.

18. The method of claim 14, comprising converging the first airflow path and the second airflow path prior to exiting the welder-generator.

19. The method of claim 14, wherein the weld components comprise rectifiers, reactors, stabilizers, electronic modules, PC boards, or a combination thereof.

20. The method of claim 14, wherein the engine, the generator, the weld components, and the muffler are disposed within a common enclosure of the welder-generator.

* * * * *